United States Patent [19]

Salamina et al.

[11] Patent Number: 5,541,541
[45] Date of Patent: Jul. 30, 1996

[54] COMPARATOR CIRCUIT FOR DECREASING SHOOT-THROUGH CURRENT ON POWER SWITCHES

[75] Inventors: Nicolas Salamina, Sachse; Roy A. Hastings, Allen, both of Tex.

[73] Assignee: Texas Instruments Incorporated, Dallas, Tex.

[21] Appl. No.: 344,199

[22] Filed: Nov. 23, 1994

[51] Int. Cl.$^6$ ............................................. H03K 3/00
[52] U.S. Cl. ............................ 327/108; 327/77; 326/83
[58] Field of Search ............................... 326/27, 83, 121; 327/74, 77, 108, 110, 111, 112, 379

[56] References Cited

U.S. PATENT DOCUMENTS

| | | | |
|---|---|---|---|
| 4,633,381 | 12/1986 | Upadhyay | 363/56 |
| 5,365,118 | 11/1994 | Wilcox | 307/571 |
| 5,408,150 | 4/1995 | Wilcox | 327/108 |

OTHER PUBLICATIONS

Keith H. Billings, Switchmode Power Supply Handbook 1989 (chapter 19, pp. 144–147).
Frank Goodenough, Electronic Design, "MOSFET–Drivers Design Cuts 'Shoot–Thru' Losses During Output Stage Switching", Mar. 7, 1994 pp. 38,40.
John G. Kassakian et al., Principles of Power Electronics, 1991 (chapter 9, pp. 210,218).
David A. Hodges & Horace G. Jackson, Analysis & Design of Digital Integrated Circuits, 1983 chapter 3, p. 98.

Primary Examiner—Timothy P. Callahan
Assistant Examiner—Jeffrey Zweizig
Attorney, Agent, or Firm—Thomas G. Eschweiler; James C. Kesterson; Richard L. Donaldson

[57] ABSTRACT

A low power, break before make output circuit includes an output transistor pair 12 and 14, a first control circuit 20, a second control circuit 22, a first comparator 16, and a second comparator 18. First control circuit 20 has a first input coupled to a first digital control input and an output coupled to a control terminal of a first transistor 12 in the output transistor pair. Second control circuit 22 has a first input coupled to a second digital control input and an output coupled to a control terminal of a second transistor 14 in the output transistor pair. First comparator 16 has an input connected to the output of first control circuit 20 and an output connected to the second input of second control circuit 22. First comparator 16 compares a voltage at the control terminal of first transistor 12 to a first predetermined voltage and formulates a voltage at its output in response to the comparison. Second comparator 18 has an input connected to the output of second control circuit 22 and an output connected to the second input of first control circuit 20. Second comparator 18 compares a voltage at the control terminal of second transistor 14 to a second predetermined voltage and formulates a voltage at its output in response to the comparison. The voltages at the output of first comparator 16 and second comparator 18 influence the outputs of first control circuit 20 and second control circuit 22 thereby ensuring that first transistor 12 is not conducting when second transistor 14 is activated.

10 Claims, 4 Drawing Sheets

5,541,541

COMPARATOR CIRCUIT FOR DECREASING SHOOT-THROUGH CURRENT ON POWER SWITCHES

FIELD OF THE INVENTION

This invention relates to electronic circuits and more particularly relates to control circuitry for driving output devices.

BACKGROUND OF THE INVENTION

When using totem pole output circuit configurations (sometimes called push-pull outputs) as illustrated in prior art circuit 99 of FIG. 1, one often encounters a phenomena called "shoot-through." Because two transistors are driven in unison, them is a short period of time during which both transistors are conducting simultaneously. As is shown in FIG. 1a, as the gate voltage drops from Vcc to ground, M1 gradually turns on as M2 is gradually turning off. During the time when the gate voltage is at an intermediate level, a pulse of current passes from supply Vcc through M1 and M2 to circuit ground. This pulse of current is known as "shoot-through" or "through current."

Because transistors in totem pole output configurations are designed for minimum on resistance, "through currents" can exceed the working current levels in a circuit. For example, a 1A totem pole circuit could see "through currents" of 5A. Although "shoot through" pulses are narrow, substantial efficiency losses may result if the currents are substantially large. Losses in efficiency are unacceptable in micro-power applications. In addition, the lost power is dissipated in the output transistors and requires larger heat sinks which are costly in applications that require space-efficient packaging.

In addition to lost efficiency, "through currents" may cause premature device failures which cause reliability problems. "Through currents" also produce substantial noise which may result in erratic circuit operation and undesired RFI/EMI (radio frequency interference/electromagnetic interference) problems.

There are several prior art approaches to controlling through currents. One prior art solution uses external resistive limiting. Unfortunately, this solution only reduces, but does not eliminate "through currents." A resistor is a lossy element and thus adds dissipation losses of its own, thus reducing efficiency.

Another prior art solution to "through currents" involves inductive snubbing, which eliminates the "through currents." However, the inductive elements reduce the circuit's performance and require extra external components which are undesirable.

Yet another prior art solution uses non-overlapping timing signals. In this solution each of the transistors in the totem pole output are driven with a different signal, created by a non-overlapping clock generator as illustrated in prior art FIG. 2. This is often called a "break-before-make" configuration because one transistor is assured to be non-conducting before the other transistor begins conduction. The problems with this solution is that "dead time" introduced by the non-overlapping clock generator diminishes the circuit's performance. Additionally, the "dead time" must be made long enough to operate without "through currents" under worst case process conditions. Such guardbanding reduces circuit performance.

Still another prior art solution utilizes the concept of non-overlapping timing signals in adaptive "dead time" controllers. These circuits compute the duration of "dead time" by monitoring the voltage waveforms so that only the minimal "dead time" necessary is inserted to prevent "through currents" from occurring. The solution has been to use a comparator circuit to detect voltage levels of the driving transistor as shown in prior art FIG. 3, but this solution requires DC quiescent current. DC quiescent current, even at low levels, is unacceptable for many applications such as portable applications requiring battery operated equipment or any other micro-power application.

It is an object of this invention to provide a "break-before-make" adaptive "dead time" output control circuit that is independent of output loading and requires no DC quiescent current and no external components. Other objects and advantages of the invention will become apparent to those of ordinary skill in the art having reference to the following specification together with the drawings herein.

SUMMARY OF THE INVENTION

A low power, break-before-make output circuit includes a push-pull output transistor pair, a control means coupled to control terminals of the output transistor pair, and comparing means coupled to the control terminals of the output transistor pair and the control means. The comparing means compares voltages at the control terminals of the output transistor pair to predetermined voltage levels and communicates the comparison to the control means which manipulates the voltages at the control terminals of the output transistor pair in response to the comparison without any static power dissipation, thereby ensuring that a first transistor of the output transistor pair is not conducting before a second transistor of the output transistor pair begins to conduct.

DETAILED DESCRIPTION

Figure 1:
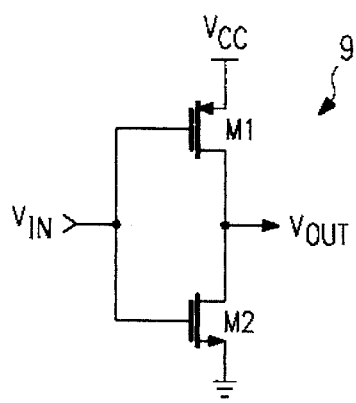
FIG. 1 is a schematic diagram illustrating a prior art totem pole output circuit 11.
Figure 1A:
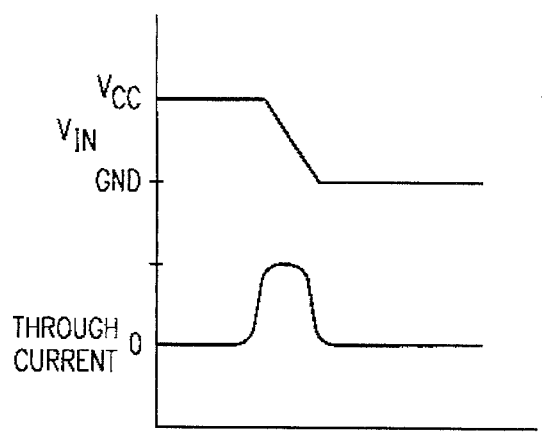
FIG. 1a is a graph illustrating "shoot-through" current in prior art totem pole output circuit 11 of FIG. 1.
Figure 2:
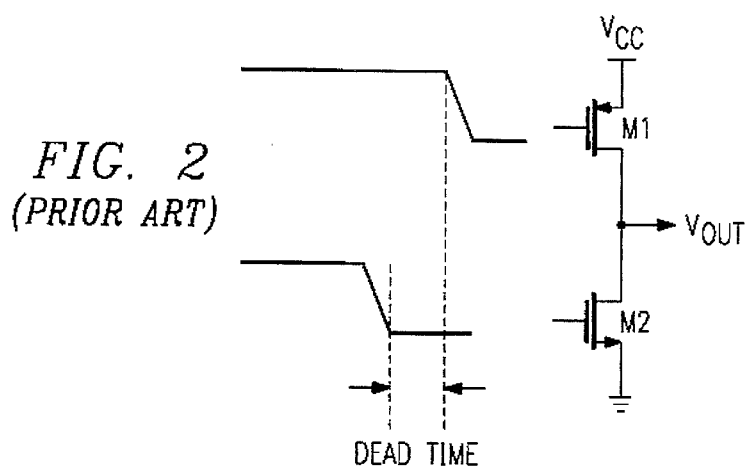
FIG. 2 is a combined graph and schematic diagram illustrating a prior art adaptive "dead time" control circuit 13.
Figure 3:
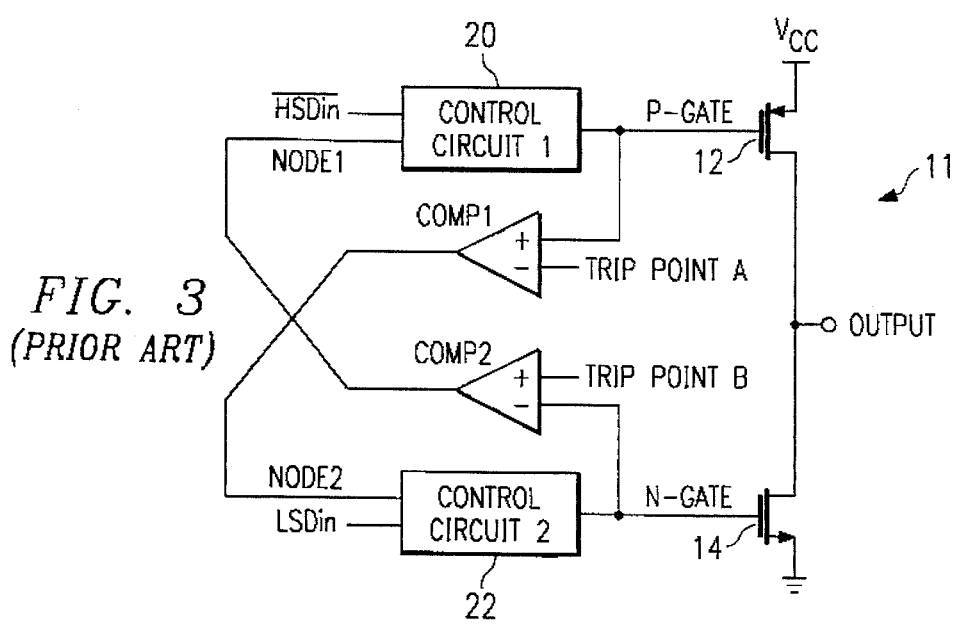
FIG. 3 is a combined block diagram/schematic diagram illustrating in greater detail a prior art adaptive "dead time" control circuit 10 for decreasing shoot-through current.

FIG. 3 is a prior art combined block diagram/schematic diagram illustrating an adaptive "dead time" control circuit 11 for decreasing shoot-through current on power MOS switches. Circuit 11 utilizes standard, prior art comparators COMP1 and COMP2 and exhibits substantial power dissipation through quiescent current conduction through comparators COMP1 and COMP2 which is highly undesirable in micro-power applications.

Figure 4:
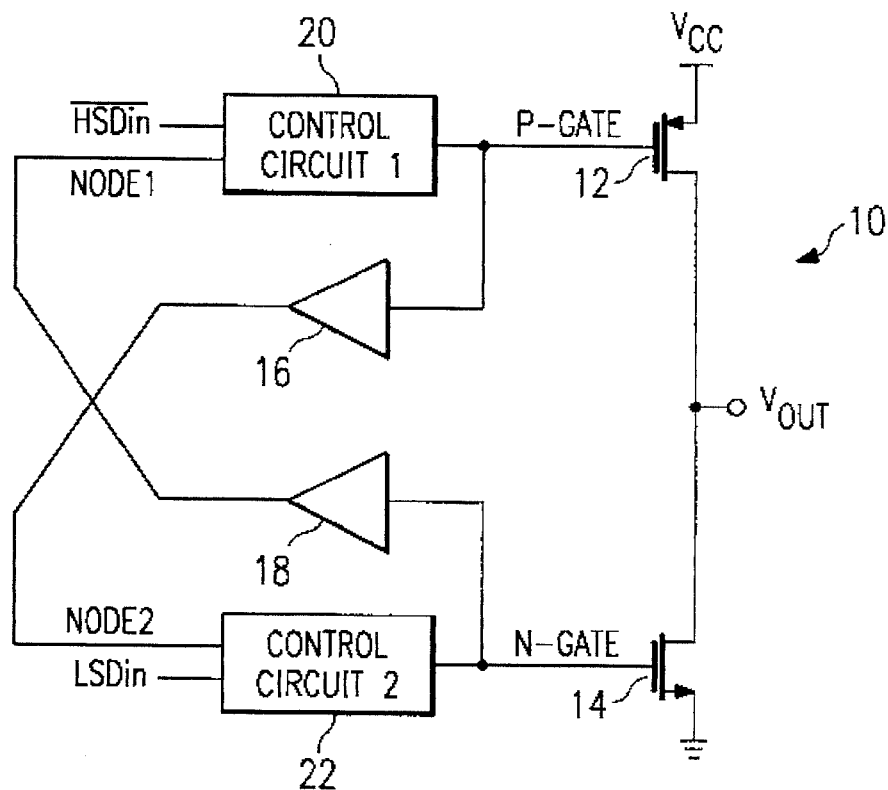
FIG. 4 is an embodiment of the invention, an adaptive "dead time" control circuit utilizing comparators 16 and 18 of FIG. 7.

FIG. 4 is a combined block diagram/schematic diagram illustrating a novel adaptive "dead time" control circuit 10 utilizing novel comparators 16 and 18. Although the description of the invention is in the context of power MOS switches it should be understood that the invention is not limited to power MOS applications, but is applicable to any totem pole (push-pull) output configuration using high input impedance (voltage driven) switches. A totem pole output transistor configuration exists in FIG. 4 with a PMOS transistor 12 connected in series with an NMOS transistor 14 between a voltage source Vcc and circuit ground. The output transistors 12 and 14 may be either internal or external devices (integrated onto the same substrate or may be independent). A first control circuit 20 is connected to a gate terminal of PMOS transistor 12 and an input of a first comparator 16. First control circuit 20 also is connected to a digital input HSDin(bar) and to an output of a second comparator 18. A second control circuit 22 is connected to a gate terminal of NMOS transistor 14 and an input of second comparator 18. Second control circuit 22 also is connected to a digital input LSDin and an output of first comparator 16.

Figure 5:
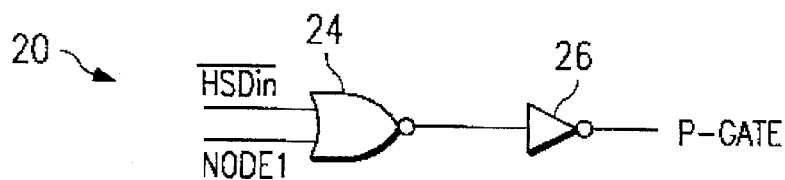
FIG. 5 is a logic diagram illustrating control circuit 20 of FIG. 4.

FIG. 5 is a logic diagram illustrating an embodiment of first control circuit 20 of FIG. 4. First control circuit 20 has a NOR gate 24 having a first input connected to digital input HSDin(bar) and a second input connected to the output of second comparator 18 (NODE1). An output of NOR gate 24 is connected to an input of an inverting power driver 26. Inverting power driver 26 has an output which forms the output (P-gate) of first control circuit 20 and is connected to the gate terminal of PMOS transistor 12.

Figure 5A:
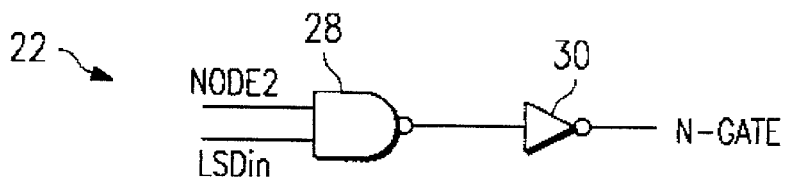
FIG. 5a is a logic diagram illustrating control circuit 22 of FIG. 4.

FIG. 5a is a logic diagram illustrating an embodiment of second control circuit 22 of FIG. 4. Second control circuit 22 has a NAND gate 28 having a first input connected to digital input LSDin and a second input connected to the output of first comparator 16 (NODE2). An output of NAND gate 28 is connected to an input of an inverting power driver 30. Inverting power driver 30 has an output which forms the output (N-gate) of second control circuit 22 and is connected to the gate terminal of NMOS transistor 14.

Figure 6:
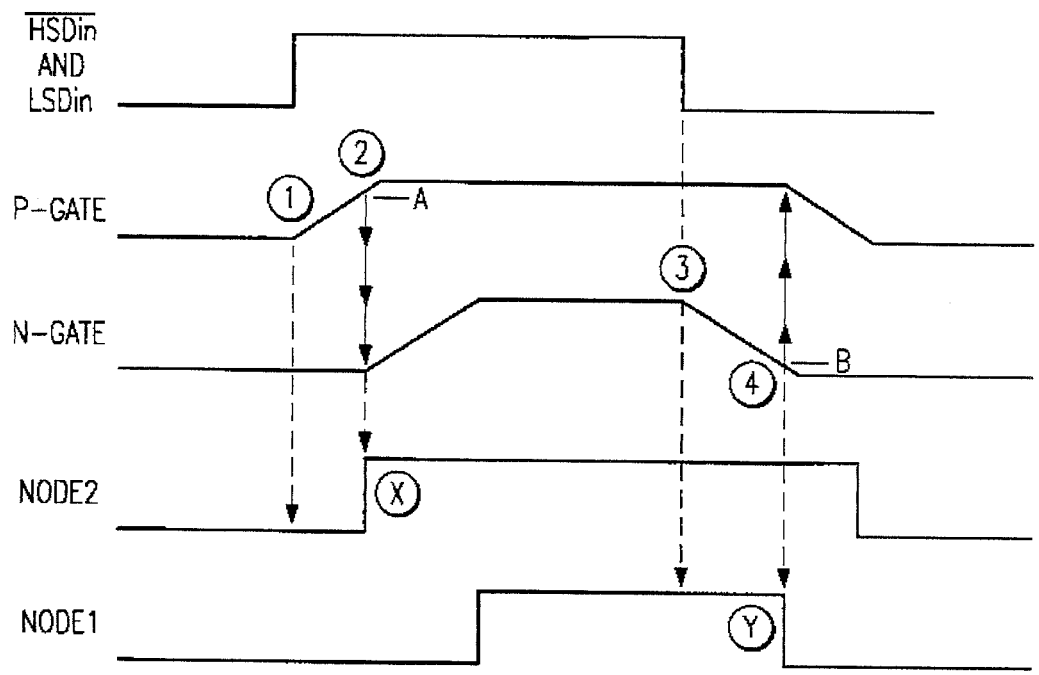
FIG. 6 is a timing diagram illustrating the timing relationships of various nodes in comparator circuit 10 of FIG. 4 utilizing novel comparators 16 and 18 of FIG. 7.

FIG. 6 is a timing diagram illustrating the voltage waveform timing relationship between various nodes in comparator circuit 10 of FIG. 4. The voltage waveforms illustrated are digital inputs HSDin(bar) and LSDin, the gate terminal voltages of PMOS transistor 12 and NMOS transistor 14 (P-gate and N-gate) and the outputs of comparators 16 and 18 (NODE1 and NODE2).

Figure 7:
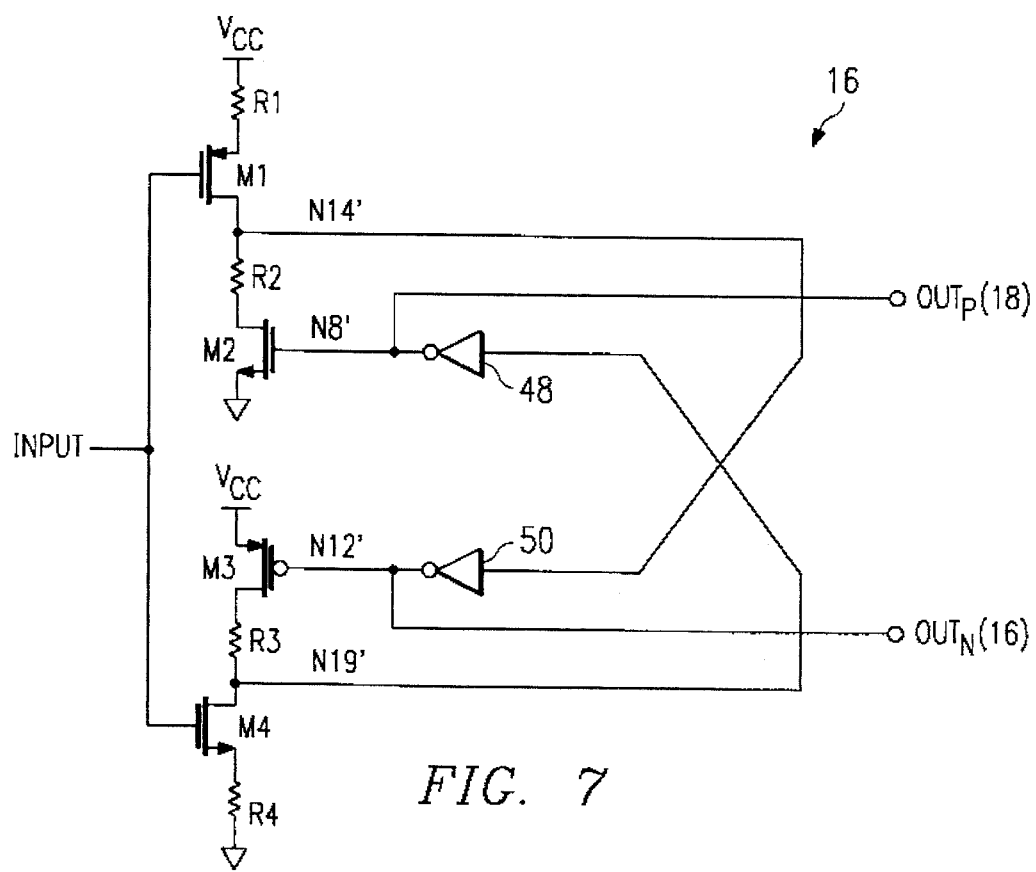
FIG. 7 is a combined block diagram/schematic diagram illustrating the preferred embodiment of the invention, comparators 16 and 18 which may operate in comparator circuit 10 in FIG. 4 to produce adaptive "dead time" control with zero static (quiescent) current.

FIG. 7 is a combined block diagram/schematic diagram illustrating novel comparators 16 and 18 within circuit 10 of FIG. 4. Both comparator 16 and comparator 18 have the same internal circuit with their only difference being where their output is taken. Comparator 16 has its output taken from an output of inverter 50 while comparator 18 has its output taken from an output of inverter 48. Both comparators 16 and 18 have an input connected to a gate terminal of a PMOS transistor M1 and an input connected to a gate terminal of an NMOS transistor M4. M1 is connected in series between a first resistor R1 (which in turn is connected to a supply voltage Vcc) and a second resistor R2. An NMOS transistor M2 is connected in series between R2 and circuit ground. M4 is connected in series between a third resistor R3 and a fourth resistor R4 which in turn is connected to circuit ground. A PMOS transistor M3 is connected in series between R3 and supply voltage Vcc. The junction between M1 and R2 is connected to inverter 50 which in turn is connected to a gate terminal of M3. The junction between R3 and M4 is connected to inverter 48 which in turn is connected to a gate terminal of M2. Comparators 16 and 18 of FIG. 4 and shown in detail in FIG. 7 develop their trip points internally and have no need of a second input.

Figure 8:
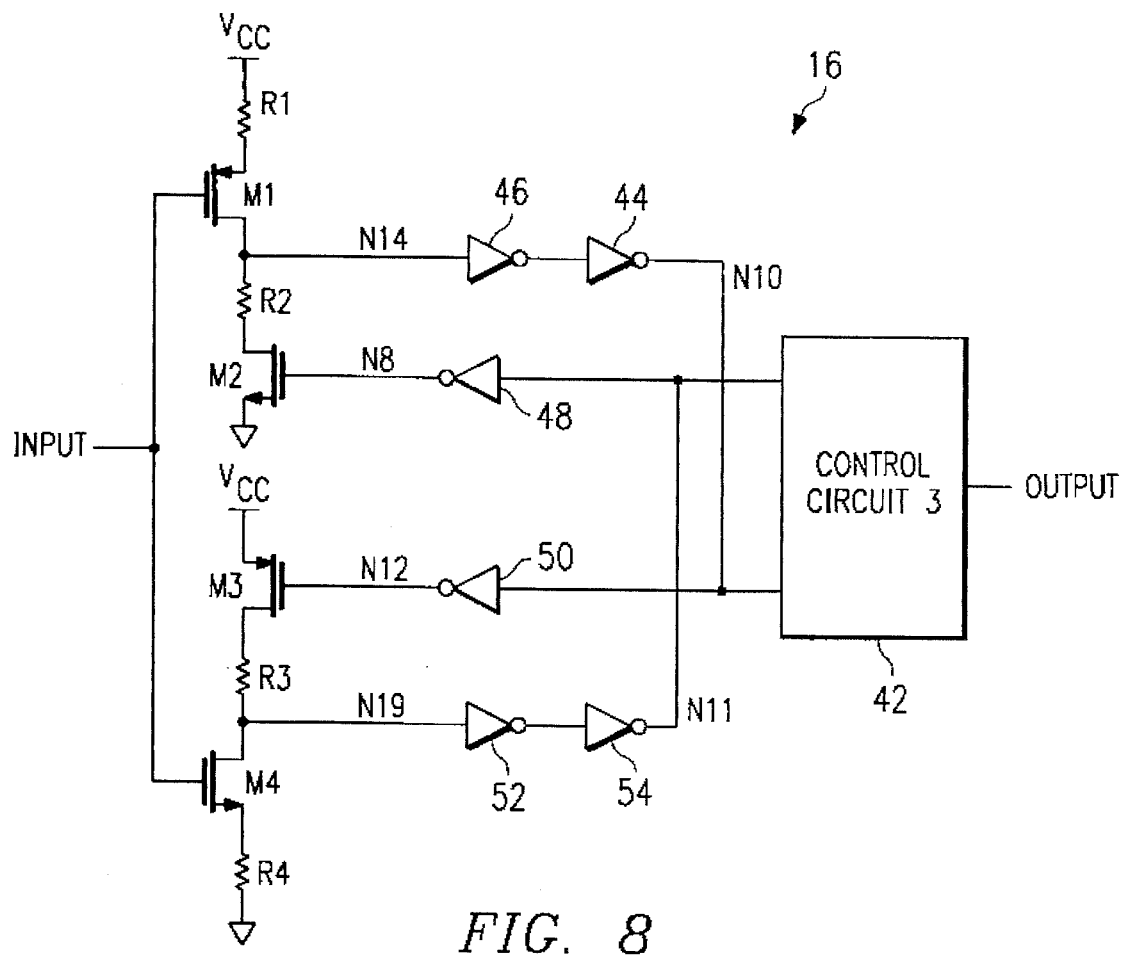
FIG. 8 is a combined block diagram/schematic diagram illustrating an alternative embodiment of the invention, comparators 16 and 18 which may be used in circuit 10 of FIG. 4.

FIG. 8 is a combined block diagram/schematic diagram illustrating comparators 16 and 18 of FIG. 4. Both comparator 16 and comparator 18 have the same internal circuitry. Both comparators 16 and 18 have an input connected to a gate terminal of a PMOS transistor M1 and to a gate terminal of an NMOS transistor M4. M1 is connected in series between a first resistor R1 (which in turn is connected to a supply voltage Vcc) and a second resistor R2. An NMOS transistor M2 is connected in series between R2 and circuit ground. M4 is connected in series between a third resistor R3 and a fourth resistor R4 which in turn is connected to circuit ground. A PMOS transistor M3 is connected in series between R3 and supply voltage Vcc. A first inverter 46 has an input coupled to a source terminal of M1 and is connected in series with a second inverter 44 which in turn is connected to a third control circuit 42. Inverter 44 also is connected to a third inverter 50 which in turn is connected to a gate terminal of M3. A fourth inverter 52 has an input coupled to a drain terminal of M4 and is connected in series with a fifth inverter 54 which in turn is connected to third control circuit 42. Inverter 54 also is connected to a sixth inverter 48 which in turn is connected to a gate terminal of M2. As stated for FIG. 7, comparators 16 and 18 develop their trip points internally and have no need of a second input.

Figure 9:
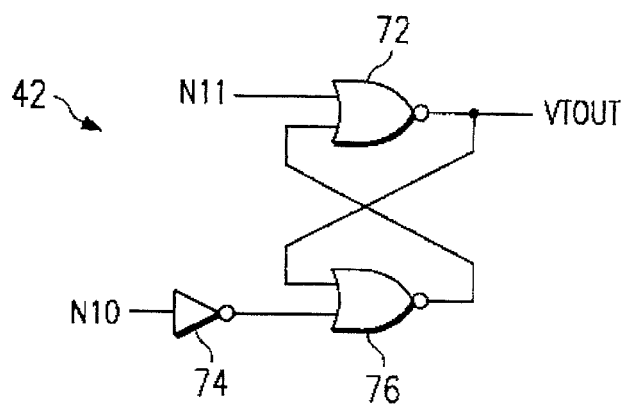
FIG. 9 is a logic diagram illustrating control circuit 42 of FIG. 8.

FIG. 9 is a logic diagram illustrating third control circuit 42 of FIG. 8. Third control circuit 42 has a NOR gate 72 having a first input connected to the output of inverter 54 of FIG. 8 and a second input that is connected to an output of a second NOR gate 76. NOR gate 72 has an output that forms the output of third control circuit 42 and also forms a first input to NOR gate 76. An inverter 74 has an input connected to the output of inverter 44 of FIG. 8 and an output that forms the second input of NOR gate 76.

The following is a functional description of the invention of FIG. 7 within circuit 10 of FIG. 4. In this description of circuit 10 of FIG. 4, digital control inputs HSDin(bar) and LSDin are connected together. However circuit 10 could operate with HSDin(bar) and LSDin operating independently. When HSDin(bar) (and therefore LSDin) goes high and NODE1 is low, the output of first control circuit 20, the gate terminal of PMOS transistor 12 (hereinafter called P-gate) goes high as shown in FIG. 6 (point 1). The slope of P-gate is less than that of HSDin(bar) because of the substantial gate capacitance of PMOS transistor 12. At some predetermined voltage level (called trip point A) the output of first control circuit 20 triggers comparator 16. The value of trip point A is able to be manipulated by the designer and will be discussed in conjunction with FIG. 7. When comparator 16 triggers, its output (NODE2) goes high (point X of FIG. 6). The digital input combination of NODE2 being high and LSDin being high causes the output of second control circuit 22, the gate terminal of NMOS transistor 14 (hereinafter called N-gate) to go high. The value of trip point A (see point 2 of FIG. 6) should be set greater than the difference between Vcc and the threshold voltage ($Vt_p$) of PMOS transistor 12 (Vcc–$Vt_p$) to ensure that PMOS transistor 12 is off before NMOS transistor 14 is turned on.

Similar to the slope of P-gate, the slope of N-gate is less than that of NODE2 because of the substantial gate capacitance of NMOS transistor 14. When N-gate reaches a predetermined voltage level the output (NODE1) of second comparator 18 triggers and goes high. The combination on NODE1 being high and HSDin(bar) being high results in no change to the output of first control circuit 20 (P-gate); therefore P-gate remains high thereby ensuring PMOS transistor 12 stays off.

When HSDin(bar) and LSDin go low, NODE1 and NODE2 are still high. The combination of HSDin(bar) being low and NODE1 being high results in no change to the output of first control circuit (P-gate); therefore PMOS transistor 12 stays off. The combination of LSDin being low and NODE2 being high results in the output of second control circuit 22 (N-gate) going low (point 3 of FIG. 6). When N-gate falls below trip point B the output of comparator 18 trips and NODE1 goes low (point Y of FIG. 6). When NODE1 goes low, the combination of NODE1 being low and HSDin(bar) being low causes the output of first control circuit 20 (P-gate) to go low. PMOS transistor 12 will begin conducting when P-gate falls a threshold voltage ($Vt_p$) below the supply voltage Vcc.

It is important to note that circuit 10 of FIG. 4 exhibits a "break before make" circuit configuration provided that internal trip points (trip point A and trip point B of comparators 16 and 18) are set appropriately. For example, trip point A of comparator 16 should be set high enough to ensure that PMOS transistor 12 is off (not conducting) before comparator 16 triggers high. This can be done by setting trip point A above the difference between supply voltage Vcc and the threshold voltage ($Vt_p$) of PMOS transistor 12 (Vcc–$Vt_p$). Similarly, trip point B of comparator 18 should be set low enough to ensure that NMOS transistor 14 is off (not conducting) before comparator 18 triggers low. This can be done by setting trip point B below the threshold voltage ($Vt_N$) of NMOS transistor 14.

The operation of comparator 16 of FIG. 7, an embodiment of the invention, is now described in detail. Comparator 18 has the same schematic as comparator 16 except that resistor values and transistor sizings may differ depending upon the desired trip points and the output of comparator 18 is taken from a different node.

In FIG. 7, when the input is low, M4 is off and M1 is on. When M1 is on, node N14' is pulled high and node N12' is pulled low through inverter 50. With N12' low, M3 is on, however no current is conducting through M3 because M4 is off. When M3 is on, node N19' is pulled high thereby causing node N8' to be low, which means $OUT_p(18)$ is low.

As the input to comparator 16 transitions from low to high, comparator 16 goes through five phases of operation. In phase 1, the input voltage is less than the threshold voltage $Vh_4$ of M4. Therefore M4 remains off and the comparator requires no supply current. In phase 2, the input voltage exceeds $Vt_4$ and current begins to flow through M3, R3, M4 and R4. M4 now acts as a source follower, setting the current flow through R4, and so the voltage at node N19' is roughly equal to:

$$V(\text{node } 19') = Vcc - (R3/R4)(Vin - Vgs_{M4}).$$

Since R3=N*R4, where N is a constant, the equation above has a gain factor "N" that allows one to minimize the change in input voltage during phase 2.

In phase 3, the voltage at node N19' drops below the transition threshold for inverter 48, node N8' goes high, turning on M2. Now current begins to flow through R1, M1, R2 and M2. M1 acts as a source follower, setting the current flow through R1, and so the voltage at N14' is roughly equal to:

$$V(\text{node } 14') = (R2/R1)(Vcc - Vin - Vgs_{M1}).$$

Since R2=M*R1, where "M" is a constant, the equation above has a gain factor "M" that allows one to minimize the change in input voltage during phase 4 (to be discussed below).

In phase 4, the voltage at node N14' drops below the transition threshold for inverter 50, and node N12' goes high. This causes the output of comparator 16 to transition from low to high. Simultaneously, M3 is turned off. This stops current flow through M3, R3, M4 and R4. However, M4 remains on, and pulls N19' to ground, so the comparator's operation is unaffected. In phase 5, the input voltage continues to rise. Eventually it exceeds (Vcc–$Vt_{M1}$) where $Vt_{M1}$ is the threshold voltage of M1. Current now stops flowing through R1, M1, R2 and M2 and comparator 16 (or 18) stops drawing supply current.

The trip point ($V_{trip16}$) of comparator 16 is, as mentioned above, the point where the voltage on N14' crosses the transition threshold ($V_{trans50}$) of inverter 50. Therefore, this trip point is:

$$V_{trip16} = Vcc - Vgs_{M1} - (R1/R2)V_{trans50},$$

where R2/R1 is equal to "M". If "M" is made large, the last term in the above equation becomes small, and the threshold $V_{trip16}$ moves closer to Vcc–$Vgs_{M1}$. By appropriately selecting the value of "M", trip point A of comparator 16 in FIG. 6 can be set as desired.

In a similar manner, the trip point ($V_{trip18}$) of comparator 18 is the point where the voltage on N19' crosses the transition threshold $V_{trans48}$ of inverter 48. Therefore, this trip point is:

$$V_{trip18} = (R4/R3)(Vcc - V_{trans48}) + Vgs_{M4}.$$

where R3/R4 is equal to "N". If "N" is made large the first term in the above equation becomes small, and the threshold $V_{trip18}$ moves closer to $Vgs_{M4}$. By appropriately selecting the value of "N", trip point B of comparator 18 in FIG. 6 can be set as desired.

The transition thresholds ($V_{trans48}$ and $V_{trans50}$) can be computed given the sizes of the transistors inside inverters 48 and 50. With this knowledge, resistors R1, R2, R3 and R4 can be set to provide desired thresholds $V_{trip16}$ and $V_{trip18}$. By making "M" and "N" large (for example M=N=9), the thresholds are not only adjusted to desirable voltages, but the sensitivity of the thresholds to changes in transistor parameters in the inverters is minimized.

The following is a functional description of the invention with regard to FIG. 8. In this description of circuit 10 of FIG.

4, digital control inputs HSDin(bar) and LSDin are connected together. However circuit 10 could operate with HSDin(bar) and LSDin operating independently. When HSDin(bar) (and therefore LSDin) goes high and NODE1 is low, the output of first control circuit 20, the gate terminal of PMOS transistor 12 (hereinafter called P-gate) goes high as shown in FIG. 6 (point 1). The slope of P-gate is less than that of HSDin(bar) because of the substantial gate capacitance of PMOS transistor 12. At some predetermined voltage level (called trip point A) the output of first control circuit 20 triggers comparator 16. The value of trip point A is able to be manipulated by the designer and will be discussed in conjunction with FIG. 8. When comparator 16 triggers, its output (NODE2) goes high (point X of FIG. 6). The digital input combination of NODE2 being high and LSDin being high causes the output of second control circuit 22, the gate terminal of NMOS transistor 14 (hereinafter called N-gate) to go high. The value of trip point A (see point 2 of FIG. 6) should be set greater than the difference between Vcc and the threshold voltage ($Vt_p$) of PMOS transistor 12 ($Vcc-Vt_p$) to ensure that PMOS transistor 12 is off before NMOS transistor 14 is turned on.

Similar to the slope of P-gate, the slope of N-gate is less than that of NODE2 because of the substantial gate capacitance of NMOS transistor 14. When N-gate reaches a predetermined voltage level the output (NODE1) of second comparator 18 triggers and goes high. The combination on NODE1 being high and HSDin(bar) being high results in no change to the output of first control circuit 20 (P-gate); therefore P-gate remains high thereby ensuring PMOS transistor 12 stays off.

When HSDin(bar) and LSDin go low, NODE1 and NODE2 are still high. The combination of HSDin(bar) being low and NODE1 being high results in no change to the output of first control circuit (P-gate); therefore PMOS transistor 12 stays off. The combination of LSDin being low and NODE2 being high results in the output of second control circuit 22 (N-gate) going low (point 3 of FIG. 6). When N-gate falls below trip point B the output of comparator 18 trips and NODE1 goes low (point Y of FIG. 6). When NODE1 goes low, the combination of NODE1 being low and HSDin(bar) being low causes the output of first control circuit 20 (P-gate) to go low. PMOS transistor 12 will begin conducting when P-gate falls a threshold voltage ($Vt_p$) below the supply voltage Vcc.

It is important to note that circuit 10 of FIG. 4 exhibits a "break before make" circuit configuration provided that internal trip points (trip point A and trip point B of comparators 16 and 18) are set appropriately. For example, trip point A of comparator 16 should be set high enough to ensure that PMOS transistor 12 is off (not conducting) before comparator 16 triggers high. This can be done by setting trip point A above the difference between supply voltage Vcc and the threshold voltage ($Vt_p$) of PMOS transistor 12 ($Vcc-Vt_p$). Similarly, trip point B of comparator 18 should be set low enough to ensure that NMOS transistor 14 is off (not conducting) before comparator 18 triggers low. This can be done by setting trip point B below the threshold voltage ($Vt_N$) of NMOS transistor 14.

The operation of comparator 16 of FIG. 8, an embodiment of the invention, is now described in detail. Comparator 18 has the same schematic as comparator 16 except that resistor values and transistor sizings may differ depending upon the desired trip points.

In FIG. 8, when the input is low, M4 is off and M1 is on. When M1 is on, node N14 is pulled high and node N12 is pulled low through inverters 44, 46 and 50. With N12 low,
M3 is on, however no current is conducting through M3 because M4 is off. When M3 is on, node N19 is pulled high thereby causing node N11 to be high. Therefore, the logic values at the two inputs of third control circuit 42 (nodes N10 and N11) when the input is low is: N10 high and N11 high. When both inputs to third control circuit 42 are high the output is low.

As the input to comparator 16 transitions from low to high, comparator 16, again, goes through five phases of operation. In phase 1, the input voltage is less than the threshold voltage $V_{t4}$ of M4. Therefore M4 remains off and the comparator requires no supply current. In phase 2, the input voltage exceeds $V_{t4}$ and current begins to flow through M3, R3, M4 and R4. M4 now acts as a source follower, setting the current flow through R4, and so the voltage at node N19 is roughly equal to:

$$V(\text{node } 19) = Vcc - (R3/R4)(Vin - Vgs_{M4}).$$

Since $R3 = N*R4$, where N is a constant, the equation above has a gain factor "N" that allows one to minimize the change in input voltage during phase 2.

In phase 3, the voltage at node N19 drops below the transition threshold for inverter 52, node N8 goes high, turning on M2. Inverters 48 and 54 provide additional gain, ensuring a sharp threshold for inverter 52. Now current begins to flow through R1, M1, R2 and M2. M1 acts as a source follower, setting the current flow through R1, and so the voltage at N14 is roughly equal to:

$$V(\text{node } 14) = (R2/R1)(Vcc - Vin - Vgs_{M1}).$$

Since $R2 = M*R1$, where "M" is a constant, the equation above has a gain factor "M" that allows one to minimize the change in input voltage during phase 4 (to be discussed below).

In phase 4, the voltage at node N14 drops below the transition threshold for inverter 46, and node N12 goes high, turning M3 off. Inverters 44 and 50 provide additional gain, ensuring a sharp threshold for inverter 46. When node N12 goes high, current flow through M3, R3, M4 and R4 stops. However, M4 remains on, and pulls N19 to ground, so the comparator's operation is unaffected. In phase 5, the input voltage continues to rise. Eventually it exceeds ($Vcc - Vt_{M1}$), where $Vt_{M1}$ is the threshold voltage of M1. Current now stops flowing through R1, M1, R2 and M2 and comparator 16 (or 18) stops drawing supply current.

The trip point ($V_{trip16}$) of comparator 16 is, as mentioned above, the point where the voltage on N14 crosses the transition threshold ($V_{trans46}$) of inverter 46. Therefore, this trip point is:

$$V_{trip16} = Vcc - Vgs_{M1} - (R1/R2)V_{trans46},$$

where R2/R1 is equal to "M". If "M" is made large, the last term in the above equation becomes small, and the threshold $V_{trip16}$ moves closer to $Vcc - Vgs_{M1}$. By appropriately selecting the value of "M", trip point A of comparator 16 in FIG. 6 can be set as desired.

In a similar manner, the trip point ($V_{trip18}$) of comparator 18 is the point where the voltage on N19 crosses the transition threshold $V_{trans52}$ of inverter 52. Therefore, this trip point is:

$$V_{trip18} = (R4/R3)(Vcc - V_{trans52}) + Vgs_{M1},$$

where R3/R4 is equal to "N". If "N" is made large, the first term in the equation above becomes small, and the threshold $V_{trip18}$ moves closer to $Vgs_{M4}$. By appropriately selecting the value of "N", trip point B of comparator 18 in FIG. 6 can be set as desired.

The transition thresholds ($V_{trans46}$ and $V_{trans52}$) can be computed given the sizes of the transistors inside inverters 46 and 52. With this knowledge, resistors R1, R2, R3 and R4 can be set to provide desired thresholds $V_{trip16}$ and $V_{trip18}$. By making "M" and "N" large (for example M=N=9), the thresholds are not only adjusted to desirable voltages, but the sensitivity of the thresholds to changes in transistor parameters in the inverters is minimized.

Third control circuit 42 obeys the following truth table:

| N10 | N11 | Output |
|-----|-----|--------|
| 1   | 0   | Hold   |
| 0   | 0   | 1      |
| 1   | 1   | 0      | where "Hold" indicates that control circuit 42 will "remember" (or hold) the previous state of the output. It is comprehended that any form of logic circuitry that provides the truth table above would fall within the scope of this invention. FIG. 9 is a logic diagram illustrating a logic circuit 42 that will produce the truth table shown above. Third control circuit 42 allows the use of one output and a single circuit to generate the signals supplied to Node 1 and Node 2 of FIGS. 4 and 6.

Comparators 16 and 18 of FIG. 7 have several advantages over the prior art. Firstly, comparators 16 and 18, utilized within circuit 10 of FIG. 4, prevent shoot-through current independently of capacitive loading. When the output of control circuits 20 and 22 have large capacitive loads, the gate terminals of PMOS transistor 12 and NMOS transistor 14 transition more slowly. However, circuit 10 does not "make" before it "breaks." Since the gate terminals of transistors 12 and 14 must cross either trip point A or trip point B before the other transistor conducts and since the trip points can be made to be above $Vcc-Vt_p$ or below $Vt_N$, it ensures that one transistor is off before the other transistor turns on. This can be achieved in a majority of applications because power MOSFETs often have threshold voltages which are deliberately set higher than those of the signal devices used in comparators 16 and 18. Even if the thresholds of the power transistors are equal to those of the signal transistors, this circuit can nearly eliminate through currents, for the time allowed for these currents to flow can be made very small by selecting large values for the gain factors "M" and "N" discussed above. Therefore a "break before make" configuration exists independent of capacitive loading.

Comparators 16 and 18 of FIG. 7 also advantageously allows one to vary both the high trip point and the low trip point. The high trip point may be varied by simply altering the resistor ratios of R1 and R2 of comparator 16 while the low trip point may be varied by simply altering the resistor ratios of R3 and R4 of comparator 18. This allows circuit 10 of FIG. 4 utilizing comparators 16 and 18 of FIG. 7 to be portable across various semiconductor processes that utilize MOS transistors having varying threshold voltages.

Another advantage of utilizing comparators 16 and 18 of FIG. 7 within circuit 10 of FIG. 4 is that circuit 10 draws supply current only during switching transients. More specifically, circuit 10 draws current only when $Vt_N<Vin<Vcc-Vt_p$, where $Vt_N$ is the threshold voltage of an NMOS transistor and $Vt_p$ is the threshold voltage of a PMOS transistor, as described in the description of the operation of comparator 16 of FIG. 7. This greatly reduces power dissipation, thereby allowing circuit 10 to advantageously operate in myriads of micro-power applications. This reduction in power dissipation represents a substantial advantage over prior art solutions.

Comparators 16 and 18 of FIG. 8 are an alternative embodiment to that of FIG. 7. The presence of multiple inverters 44, 46 and 50 and 48, 52 and 54 provide additional gain to sharpen the transition thresholds of the lead inverters, increasing the accuracy possible with this circuit configuration.

Although the invention has been described with reference to the preferred embodiment herein, this description is not to be construed in a limiting sense. Various modifications of the disclosed embodiment as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A low power, break before make output circuit, comprising:

an output transistor pair coupled together in series between a first and second voltage potential;

a first control circuit having a first and second input and an output, wherein the first input is coupled to a first digital control input and the output is coupled to a control terminal of a first transistor in the output transistor pair;

a second control circuit having a first and second input and an output, wherein the first input is coupled to a second digital control input and the output is coupled to a control terminal of a second transistor in the output transistor pair;

a first comparator having an input connected to the output of the first control circuit and an output connected to the second input of the second control circuit, wherein the first comparator compares a voltage at the control terminal of the first transistor to a first predetermined voltage and formulates a voltage at its output in response to the comparison, wherein the first comparator comprises:

an input coupled to the control terminal of the first transistor in the output transistor pair;

an output coupled to the second input of the second control circuit;

an upper trip point circuit having a first input coupled to the input of the first comparator, a second input, and an output which forms the output of the first comparator;

a lower trip point circuit having a first input coupled to the input of the first comparator, a second input coupled to the output of the upper trip point circuit, and an output coupled to the second input of the upper trip point circuit; and wherein the upper trip point circuit outputs a digital high value when the input rises above a first predetermined voltage value and a digital low value otherwise, and wherein the lower trip point circuit outputs a digital high value when the input rises above a second predetermined voltage value and a digital low value otherwise;

a second comparator having an input connected to the output of the second control circuit and an output connected to the second input of the first control circuit, wherein the second comparator compares a voltage at the control terminal of the second transistor to a second predetermined voltage and formulates a voltage at its output in response to the comparison; and wherein the voltages at the output of first comparator and second comparator influence the outputs of first control circuit and second control circuit thereby ensuring that the first transistor is not conducting when the second transistor is activated.

2. The output circuit of claim 1, wherein the first control circuit outputs a digital low value when the first digital control input and the output of the second comparator are digital low values and outputs a digital high value otherwise.

3. The output circuit of claim 1, wherein the second control circuit outputs a digital high value when the second digital control input and the output of the first, comparator is a digital high value and outputs a digital low value otherwise.

4. The first comparator of claim 1, wherein the upper trip point circuit comprises:
a first resistor connected between a first voltage source and a source of a PMOS transistor;
the PMOS transistor having a gate connected to the input of the first comparator, and a drain;
a second resistor connected between the drain of the PMOS transistor and a drain of an NMOS transistor;
the NMOS transistor having a gate connected to the output of the lower trip point circuit, and a source connected to the second voltage source; and
an inverter having an input connected to the drain of the PMOS transistor and an output of which forms an output of the upper trip point circuit.

5. The first comparator of claim 4, wherein the lower trip point circuit comprises:
a PMOS transistor having a source connected to the first voltage source, a gate connected to the output of the upper trip point circuit, and a drain;
a first resistor connected between the drain of the PMOS transistor and a drain of an NMOS transistor;
the NMOS transistor having a gate connected to the input of the first comparator, and a source connected to a second resistor:
a second resistor connected between the source of the NMOS transistor and the second voltage source; and
an inverter having an input connected to the drain of the NMOS transistor and an output which forms an output of the lower trip point circuit.

6. The upper trip point circuit of claim 4, wherein the inverter comprises a plurality of inverters.

7. The lower trip point circuit of claim 5, wherein the inverter comprises a plurality of inverters.

8. A low power, break before make output circuit, comprising:
an output transistor pair coupled together in series between a first and second voltage potential;
a first control circuit having a first and second input and an output, wherein the first input is coupled to a first digital control input and the output is coupled to a control terminal of a first transistor in the output transistor pair;
a second control circuit having a first and second input and an output, wherein the first input is coupled to a second digital control input and the output is coupled to a control terminal of a second transistor in the output transistor pair;
a first comparator having an input connected to the output of the first control circuit and an output connected to the second input of the second control circuit, wherein the first comparator compares a voltage at the control terminal of the first transistor to a first predetermined voltage and formulates a voltage at its output in response to the comparison;
second comparator having an input connected to the output of the second control circuit and an output connected to the second input of the first control circuit, wherein the second comparator compares a voltage at the control terminal of the second transistor to a second predetermined voltage and formulates a voltage at its output in response to the comparison, wherein the second comparator comprises:
an input coupled to the control terminal of the second transistor in the output transistor pair;
an output coupled to the second input of the first control circuit;
an upper trip point circuit, one input of which is coupled to the input of the comparator, a second input, and an output;
a lower trip point circuit, one input of which is coupled to the input of the comparator, and a second input of which is coupled to the output of the upper trip point circuit, and an output coupled to the second input of the upper trip point circuit and which forms the output of the second comparator; and
wherein the upper trip point circuit outputs a digital high value when the input rises above a third predetermined voltage value and a digital low value otherwise, and wherein the lower trip point circuit outputs a digital high value when the input rises above a fourth predetermined voltage value and a digital low value otherwise, and wherein the output of the comparator is taken as the output of the lower trip point circuit, and is connected to the second input of the first control circuit; and
wherein the voltages at the output of first comparator and second comparator influence the outputs of first control circuit and second control circuit thereby ensuring that the first transistor is not conducting when the second transistor is activated.

9. A low power, break before make output circuit, comprising:
an output transistor pair coupled together in series between a first and second voltage potential;
a first control circuit having a first and second input and an output, wherein the first input is coupled to a first digital control input and the output is coupled to a control terminal of a first transistor in the output transistor pair;
a second control circuit having a first and second input and an output, wherein the first input is coupled to a second digital control input and the output is coupled to a control terminal of a second transistor in the output transistor pair;
a first comparator having an input connected to the output of the first control circuit and an output connected to the second input of the second control circuit, wherein the first comparator compares a voltage at the control terminal of the first transistor to a first predetermined voltage and formulates a voltage at its output in response to the comparison, wherein the first comparator comprises:
an input coupled to the control terminal of the first transistor in the output transistor pair;
an upper trip point circuit coupled to the input;
a lower trip point circuit coupled to the input and to the upper trip point circuit;

a third control circuit coupled to the upper trip point circuit and the lower trip point circuit, wherein the third control circuit has an output that forms the output of the first comparator; and wherein the upper trip point circuit outputs a digital high value when the input rises above a predetermined voltage value and the lower trip point circuit outputs a digital high value when the output rises above a second predetermined voltage value, and further wherein the third control circuit outputs a digital high value when the upper trip point circuit and lower trip point circuit output digital high values, outputs a digital low value when upper trip point circuit and lower trip point circuit output digital low values, and maintains its digital value when the upper trip point circuit outputs a digital low value and lower trip point circuit outputs a digital high value;

a second comparator having an input connected to the output of the second control circuit and an output connected to the second input of the first control circuit, wherein the second comparator compares a voltage at the control terminal of the second transistor to a second predetermined voltage and formulates a voltage at its output in response to the comparison; and wherein the voltages at the output of first comparator and second comparator influence the outputs of first control circuit and second control circuit thereby ensuring that the first transistor is not conducting when the second transistor is activated.

10. The output circuit of claim 9, wherein the third control circuit comprises:

a second dual input NOR gate having a first input coupled to the output of the lower trip point circuit, a second input and an output, wherein the output forms the output of the third control circuit;

a third dual input NOR gate having a first input coupled to the output of the second dual input NOR gate, a second input and an output coupled to the second input of the second dual input NOR gate; and an inverter having an input coupled to the output of the upper trip point circuit and an output coupled to the second input of the third dual input NOR gate.

* * * * *